United States Patent [19]

Isogai

[11] 4,355,245
[45] Oct. 19, 1982

[54] ELECTRONIC CIRCUIT

[75] Inventor: Hideaki Isogai, Inagi, Japan

[73] Assignee: Fujitsu Limited, Kawasaki, Japan

[21] Appl. No.: 137,958

[22] Filed: Apr. 7, 1980

[30] Foreign Application Priority Data

Apr. 12, 1979 [JP] Japan .................................. 54-44640

[51] Int. Cl.³ .............................................. H03K 3/33
[52] U.S. Cl. .................................. 307/455; 307/280;
307/443
[58] Field of Search ........................ 307/455, 433, 280

[56] References Cited
U.S. PATENT DOCUMENTS

| 3,394,267 | 7/1968 | Schmidt | 307/455 |
| 3,501,647 | 3/1970 | Giacomo | 307/455 |
| 3,558,914 | 1/1971 | Schmidt | 307/455 |
| 3,560,770 | 2/1971 | Gieles | 307/455 |
| 4,246,501 | 1/1981 | Baker | 307/280 |

Primary Examiner—Harold A. Dixon
Attorney, Agent, or Firm—Staas & Halsey

[57] ABSTRACT

In an electronic circuit of a current switch construction in which the emitters of a first transistor and a second transistor are commonly connected to a constant-current supply, and a load resistor is connected to the collector of the first transistor, thereby to take out an output from the collector, the improvement being a pnp-type transistor, in which temporarily flows an electric current to a collector circuit of the first transistor when it is rendered non-conductive, which is inserted in a collector circuit of the second transistor.

6 Claims, 12 Drawing Figures

ELECTRONIC CIRCUIT

FIELD OF THE INVENTION

The present invention is concerned with an electronic circuit. More specifically, the invention is concerned with an electronic circuit of a current switch construction which has improved delay in operation or which features improved rising characteristics in the output voltage.

BACKGROUND OF THE INVENTION

A current switch is usually so constructed that emitters of a first transistor and a second transistor are commonly connected to a constant-current supply, and a load resistor is connected between the collector of at least one of the two transistors and the power supply, so that the above-mentioned collector serves as an output terminal. An input voltage is applied to the base of the first transistor, and a reference voltage (or often another input voltage) is applied to the base of the second transistor. With the thus constructed circuit, when the level of the input voltage changes so as to be higher or lower than the level of the reference voltage, one of the transistors is rendered non-conductive and the other one is rendered conductive. However, with the conventional construction of bipolar transistors the collector occupies larger areas than the emitter and establishes a large capacity with respect to the substrate. Thus, the capacity and the load resistor define a time constant which determines the rising speed of the collector potential. Accordingly, the rising speed of the output voltage from the low level to this high level is determined by the time constant. The collector potential is quickly broken from a high level to a low level when the first transistor is rendered conductive according to a small time constant determined by a small resistance while the transistor is conductive and has a capacity Cc. In order to increase the rising speed of the output voltage, it has heretofore been attempted to reduce the load resistance $R_1$. According to this method, however, increase in the current is not avoidable when it is desired to take out the same logic amplitude as before.

OBJECTS AND SUMMARY OF THE INVENTION

The object of the present invention is to provide an electronic circuit of a current switch construction having improved rising characteristics in the output voltage.

Another object of the present invention is to provide a current switch which operates at an increased speed as a result of the improvement in the rising characteristics of output voltage from a low level to a high level, which is accomplished by utilizing a current of a second transistor.

According to the present invention, there is provided an electronic circuit of a current switch construction in which the emitters of a first transistor and a second transistor are commonly connected to a constant-current supply, and a load resistor is connected to the collector of the first transistor thereby to take out the output from the collector, wherein a pnp-type transistor in which an electric current temporarily flows to a collector circuit of the first transistor when it is rendered non-conductive, is inserted in a collector circuit of the second transistor.

Further features and advantages of the present invention will become apparent from the ensuing description with reference to the accompanying drawings to which, however, the scope of the invention is in no way limited.

DESCRIPTION OF THE PREFERRED EMBODIMENTS

Figure 1:
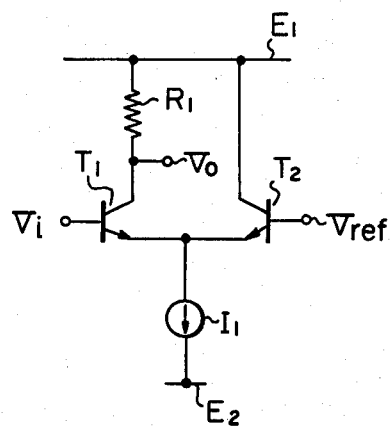
FIG. 1 is a circuit diagram illustrating a conventional current switch.

Referring to a current switch shown in FIG. 1, emitters of npn-type transistors $T_1$, $T_2$ are commonly connected to a constant-current supply $I_1$, and a load resistor $R_1$ is connected between the collector of the transistor $T_1$ and a power supply line $E_1$, so that the collector serves as an output terminal. An input voltage $V_i$ is applied to the base of the transistor $T_1$, and a reference voltage $V_{ref}$ (or often another input voltage) is applied to the base of the transistor $T_2$. When only one output is required, i.e., when the inverted output is only required, no load resistor is connected to the collector of the second transistor $T_2$, as shown in FIG. 1. In other words, the collector of the second transistor $T_2$ in many cases is directly connected to the power supply line $E_1$. The current switch operates in a customary manner. Namely, when the input voltage $V_i$ changes into a high level or a low level with respect to the reference voltage $V_{ref}$, the transistor $T_1$ is rendered conductive or non-conductive, and the transistor $T_2$ is rendered non-conductive or conductive in an opposite manner to the transistor $T_1$. However, with the conventional construction of bipolar transistors the collector occupies larger areas than the emitter or the like and establishes a large capacity Cc relative to the substrate. The capacity Cc and the load resistor $R_1$ define a time constant which determines the rising speed of the collector potential. Accordingly, the rising speed of the output voltage $V_O$ from the low level to the high level is determined by this time constant. The collector potential is quickly broken from the high level to the low level when the transistor $T_1$ is rendered conductive according to a small time constant determined by a small resistance and the capacity Cc while the transistor $T_1$ is conductive. In order to increase the rising speed of the output voltage $V_O$, it has heretofore been attempted to reduce the load resistance $R_1$. According to this method, however, an increase in the current is not avoidable when it is desired to take out the same logic amplitude as before.

The present invention is to provide a current switch which operates at high speeds by improving the rising characteristics in the output voltage from the low level to the high level utilizing by a current on the side of the transistor $T_2$. When the output voltage $V_O$ rises, the transistor $T_2$ on the reference side is rendered conductive which wastefully flows an electric current into the substrate. According to the present invention, however, it is contemplated to effectively utilize the electric current. Namely, the electric current is introduced to the collector of the transistor $T_1$ to electrically charge the collector capacity Cc of the transistor $T_1$. Consequently, the capacity Cc is electrically charged more quickly, enabling the output voltage $V_O$ to be quickly raised. The circuit of the invention is illustrated below in detail with reference to the following embodiments.

Figure 2A:
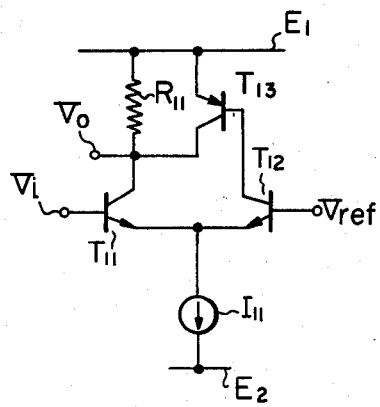
FIGS. 2A and 2B are circuit diagrams of current switches according to an embodiment of the present invention.

FIG. 2A illustrates an embodiment of the present invention. According to the circuit of FIG. 2A, an emitter-base path of a pnp-type transistor $T_{13}$ is inserted between the collector of a transistor $T_{12}$ and a power supply line $E_1$, and the collector of the transistor $T_{13}$ is connected to this collector of a transistor $T_{11}$. The circuit setup with regard to other respects is the same as that of FIG. 1. In FIG. 2A, symbol $E_2$ denotes a power supply line of the negative polarity.

Operation of the circuit is illustrated below. When an input voltage $V_i$ is a level greater than that of the reference voltage $V_{ref}$, the transistor $T_{11}$ is rendered conductive and the transistor $T_{12}$ non-conductive, and when the input voltage $V_i$ is a level smaller than that of the reference voltage $V_{ref}$, the transistor $T_{11}$ is rendered non-conductive and the transistor $T_{12}$ conductive, in the same manner as the circuit of FIG. 1. However, when the transistor $T_{11}$ is rendered non-conductive, i.e., when the output voltage $V_O$ rises, the transistor $T_{12}$ is rendered conductive, so that an electric current is allowed to flow into the transistor $T_{12}$ through the emitter-base path of the transistor $T_{13}$. The transistor $T_{13}$ therefore is rendered conductive, and a collector current is permitted to flow into the collector of the transistor $T_{11}$ which is rising. This helps to electrically charge the collector capacity of the transistor $T_{11}$. Therefore, the collector capacity is quickly charged, being assisted by the electric current which is introduced through the load resistor $R_{11}$, whereby the collector potential or, in other words, an output voltage is quickly raised to the high level.

According to the circuit shown in FIG. 2A, not only the electric charge stored in the collector capacity of the transistor $T_{11}$, but also the electric charge stored in the collector capacity of the transistor $T_{13}$, must be discharged when the transistor $T_{11}$ is rendered conductive, i.e., when the output voltage $V_O$ is broken from the high level to the low level. However, the resistance of the transistor $T_{11}$ while it is conductive is so small that the discharge is quickly effected and the break of the output voltage is not delayed very much.

Figure 2B:
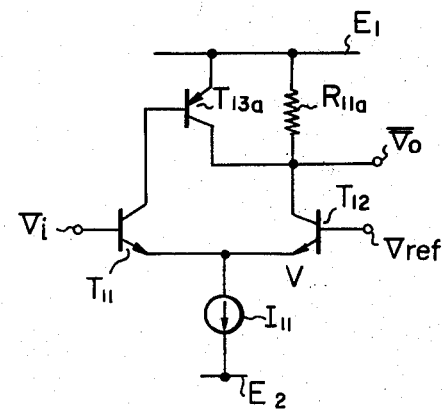

FIG. 2B illustrates a circuit which is capable of producing only a non-inverted output relative to the input voltage $V_i$. In this case, a load resistor $R_{11a}$ is connected between the transistor $T_{12}$ and the power supply $E_1$, an emitter-base path of a pnp-type transistor $T_{13a}$ is connected between the collector of the transistor $T_{11}$ and the power supply line $E_1$, and the collector of the transistor $T_{13a}$ is connected to the collector of the transistor $T_{12}$. This circuit setup with regard to other respects is the same as that of FIG. 2A. This circuit also operates in the same manner as the circuit of FIG. 2A.

Figure 3:
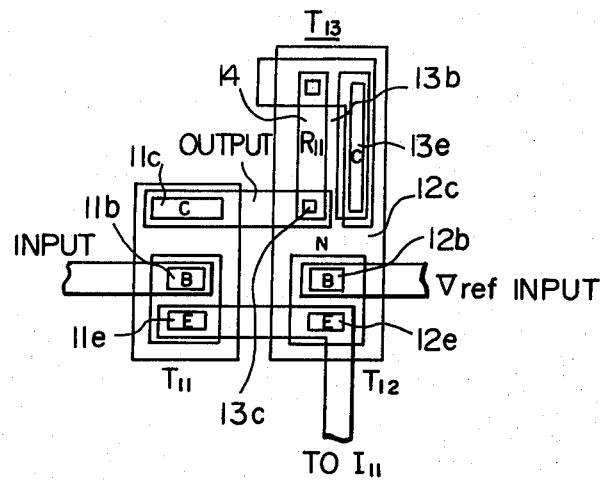
FIG. 3 is a plan view showing patterns of the current switch of FIG. 2A.

FIG. 3 is a plan view illustrating a pattern of the circuit of FIG. 2A, in which reference numerals 11e, 11b and 11c denote the emitter, base and collector of the transistor $T_{11}$, respectively, reference numerals 12e, 12b and 12c denote the emitter, base and collector of the transistor $T_{12}$, respectively, and 13e, 13b and 13c denote the emitter, base and collector of the transistor $T_{13}$, respectively. Reference numerals 13c and 14 denote a p+-type collector region and a diffusion resistance layer which are formed by being diffused in the base region 13b. According to this setup, the transistor $T_{13}$ is constituted among the p+-type collector region, the n-type layer 13b and the p+-type emitter layer (lying on the n-type layer 13b) which is not diagramatized. As the transistor $T_{13}$ of the type of distribution constant and the resistor $R_{11}$ are commonly formed among the diffusion layer 14, the circuit of this pattern can be constructed in a small size without requiring wirings.

By the addition of the pnp-type transistor $T_{13}$ as shown in FIGS. 2A and 2B, the rising characteristics of the output voltage $V_O$ or $\overline{V_O}$ can be improved without the need of decreasing the load resistance $R_{11}$. With regard to the breaking characteristics of the output voltage $V_O$, however, there still remains room for improvement. Namely, when the transistor $T_{11}$ is rendered conductive so that the output voltage $V_O$ breaks from the high level to the low level, it is necessary to discharge not only the electric charge stored in the collector capacity of the transistor $T_{11}$, but also to discharge the electric charge stored in the collector capacity of the transistor $T_{13}$. Since the transistor $T_{11}$ in itself has a small resistance while it is conductive, it can be easily understood that the discharge is carried out quickly. Under a steady state in which the transistor $T_{11}$ is non-conductive and the transistor $T_{12}$ is conductive, however, the potential between the resistor $R_{11}$ and a connection point between the transistors $T_{11}$ and $T_{13}$ rises to nearly zero volt ($E_1$ is assumed to be 0 volt). On the other hand, the base potential of the transistor $T_{13}$ is a value which is lower than the zero potential by a value dropped through the pn junction across the emitter and the base. In other words, the base potential of the transistor $T_{13}$ is a value of about $-0.8$ volt. Consequently, a forward biasing voltage is applied across the collector and the base, so that the transistor $T_{13}$ is saturated. Accordingly, a large amount of electric charge is accumulated in the junction capacity between the collector and the base of the transistor $T_{13}$; thus extended periods of time are required to discharge the accumulated electric charge. In effect, the break of the output voltage $V_O$ tends to be delayed.

Figure 4A:
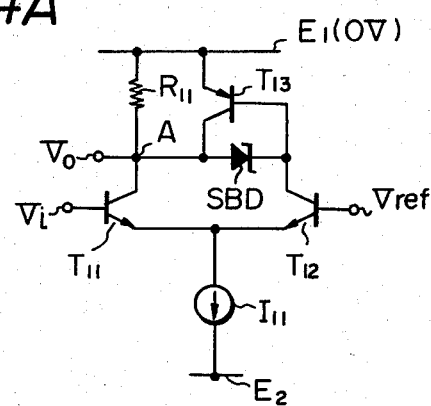
FIGS. 4A, 4B and 4C are circuit diagrams of current switches according to another embodiment of the present invention.

In order to eliminate the above-mentioned defect, the present invention provides a current switch in which the collector potential of the pnp-type transistor $T_{13}$ is clamped, so that it operates in an unsaturated region in an attempt to reduce the collector capacity and to improve the breaking characteristics. This second embodiment of the present invention is illustrated below FIG. 4A illustrates an embodiment of the present invention employing a Schottky barrier diode SBD as a clamping diode. According to this embodiment, the diode SBD is connected in the forward direction between the collector and the base of the transistor $T_{13}$. The setup with respect to other points is the same as that of FIG. 2A. When the transistor $T_{12}$ is rendered conductive by the input $V_i$ of the low level, the base potential of the transistor $T_{13}$ is $-0.8$ volt, as mentioned earlier. In this case, the transistor $T_{11}$ remains non-conductive. However, the provision of the diode SBD permits a portion of a constant current $I_{11}$ to flow through a path of $E_1$-$R_{11}$-SBD-$T_{12}$, while base currents of the transistor $T_{13}$ flow in parallel therewith. Therefore, the potential at the point A decreases below 0 volt due to the electric current which flows through the resistor $R_{11}$; the potential, however, is determined by the diode SBD. For example, if the voltage drop through the diode SBD in the forward direction is 0.4 volt, the potential at the point A is clamped to $-0.4$ volt which is higher than the base potential of $-0.8$ volt by 0.4 volt. With this constructed circuit, a voltage greater than the forward voltage (0.8 volt) is not applied across the collector and the base of the transistor $T_{13}$; thus the transistor $T_{13}$ operates in an unsaturated region. Therefore, a small amount of electric charge is accumulated in the collector capacity to improve the breaking characteristics. When the input $V_i$ changes from the low level to the high level, the output rapidly breaks from the high level to the low level (since the above-mentioned collector charge is quickly discharged).

Figure 4B:
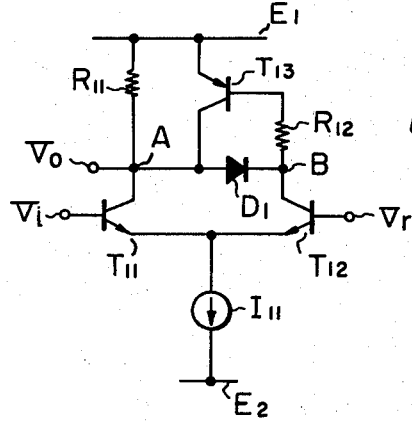

FIG. 4B illustrates another embodiment of the present invention employing an ordinary pn-junction diode $D_1$ as a clamping diode. According to this embodiment, a pn-junction diode $D_1$ is substituted for the Schottky barrier diode SBD of FIG. 4A, and a shifting resistor $R_{12}$ is inserted between the base of the transistor $T_{13}$ and the cathode (point B) of the diode $D_1$. The pn-junction diode $D_1$ has a forward voltage of 0.8 volt, like the voltage across the collector and the base of the transistor $T_{13}$. When the pn-junction diode is used for the circuit of FIG. 4A in place of the diode SBD, it is difficult to prevent the transistor $T_{13}$ from being saturated. When the potential at the point B is lowered by inserting the resistor $R_{12}$ as shown in FIG. 4B, however, the potential at the point A is lowered correspondingly, making it possible to prevent the transistor $T_{13}$ from being saturated. For example, if the voltage is dropped by 0.4 volt by the resistor $R_{12}$, the potential at the point B becomes $-1.2$ volt which is lower by 0.4 volt than $-0.8$ volt which is the base potential of the transistor $T_{13}$. Accordingly, even when the potential at the point A is clamped by the diode $D_1$ to $-0.4$ volt which is higher by 0.8 volt than the potential at the point B, the same result is obtained as that of the circuit of FIG. 4A.

Figure 4C:
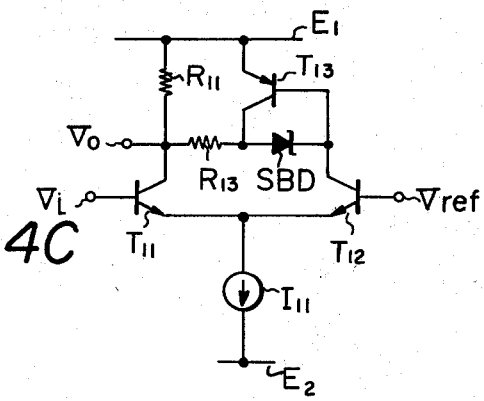

FIG. 4C illustrates yet a further embodiment of the present invention in which a resistor $R_{13}$ is inserted between the point A and the diode SBD of FIG. 4A, to increase the amplitude of the output $V_O$. When the output $V_O$ is in the high level, i.e., when the transistor $T_{12}$ is conductive, an electric current flows through a path of $E_1$-$R_{11}$-$R_{13}$-SBD-$T_{12}$ so that the collector of the transistor $T_{13}$ is clamped to a desired potential due to the diode SBD. In this case, however, the potential at the point A does not decrease to the collector potential of the transistor $T_{13}$ owing to the current which flows through the resistor $R_{13}$. Accordingly, the high level of the output $V_O$ is maintained at a high value. The resistor $R_{13}$ for amplifying the amplitude can also be employed for the circuit of FIG. 4B.

Figure 5:
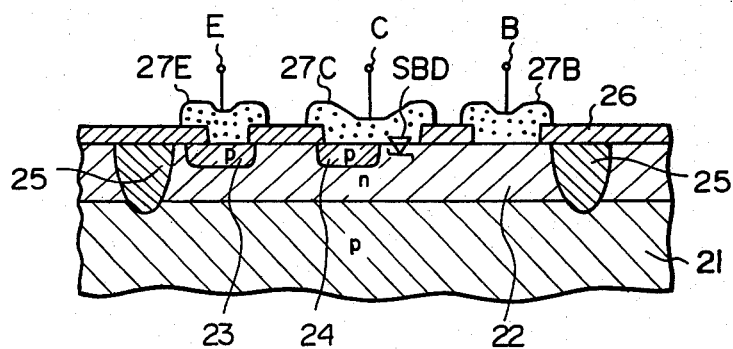
FIG. 5 is a cross-sectional view illustrating the construction of major portions of the current switch of FIG. 4A.

Generally, when the Schottky barrier diode is used as a clamping diode, the shifting resistor is not required, enabling the circuit setup to be simplified and having advantages from the standpoint of circuit construction. However, it is difficult to provide the diode SBD in the pnp-type transistor to clamp its collector potential relative to the base potential. This, however, can be easily realized if the transistor is formed in a lateral construction. Namely, FIG. 5 illustrates the construction of elements in which the pnp-type transistor $T_{13}$ (shown in FIG. 4A) and the Schottky barrier diode SBD (shown in FIG. 4A) are formed in the same land, wherein reference numeral 21 denotes a p-type silicon semiconductor substrate, 22 denotes an n-type layer which is formed on the surface of the substrate 21 and which serves as a base region, 23 and 24 denote a p-type emitter region and a p-type collector region, respectively, which are formed in the surface of the n-type layer 22, 25 denotes regions for isolating the elements, 26 denotes a surface insulation layer, and 27E, 27C and 27B denote an emitter, a collector and a base, respectively, which are in ohmic contact with the regions 22, 23 and 24, and which constitute the pnp-type transitor $T_{13}$. With the constructed device, if the collector 27C is contacted to a portion of the n-type layer 22, there is established a Schottky barrier diode SBD, so that the circuit becomes equivalent to that of FIG. 4A.

Figure 6A:
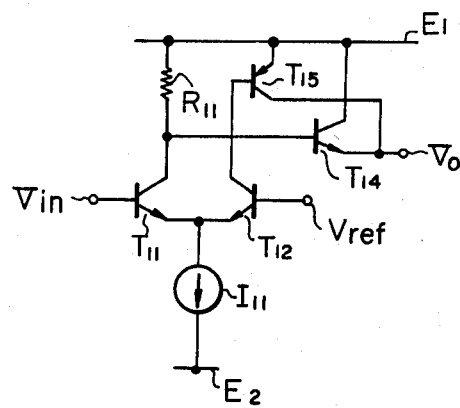
FIGS. 6A and 6B are circuit diagrams of current switches according to a further embodiment of the present invention.
Figure 6B:
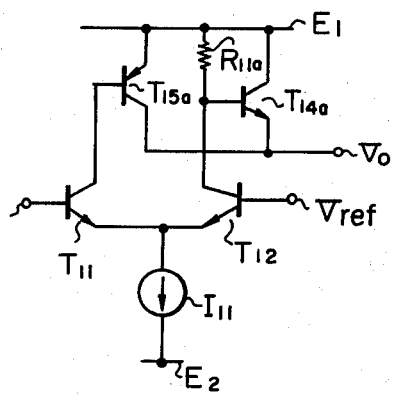

FIGS. 6A and 6B illustrate further embodiments according to the present invention, in which the outputs of the load resistors $R_{11}$ and $R_{11a}$ are produced via emitter-follower transistors $T_{14}$ and $T_{14a}$. The present invention is also applicable to the circuits of FIGS. 6A and 6B, wherein symbols $T_{15}$ and $T_{15a}$ denote transistors for improving the rising characteristics of the output voltage.

Figure 7:
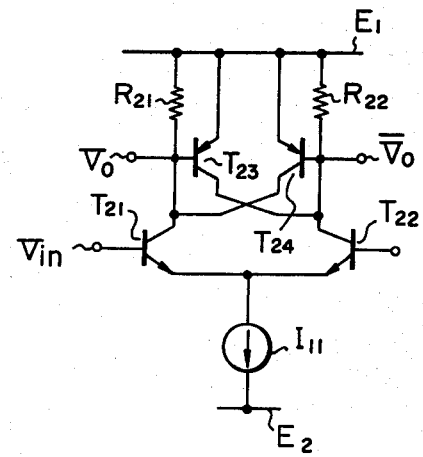
FIG. 7 is a circuit diagram of current switch according to a still further embodiment of the present invention.

FIG. 7 shows a circuit of the type of a binary output, which produces the output voltage $V_O$ from the collector of transistor $T_{22}$ of a polarity opposite to that of the output voltage $V_O$ from the collector of the transistor $T_{22}$. According to this circuit, the pnp-type transistors are inserted on both sides to improve the rising characteristics of the two output voltages. Symbols $T_{23}$ and $T_{24}$ denote the pnp-type transitors, and $R_{21}$ and $R_{22}$ denote the load resistors. The circuit of FIG. 7 operates in the same manner as the circuits of FIGS. 2A and 2B. However, since the load resistors $R_{21}$ and $R_{22}$ are inserted in parallel with the emitter-base paths of the transistors $T_{23}$, $T_{24}$, the constant current $I_{11}$ when the transistors $T_{21}$, $T_{22}$ are rendered conductive is supplied in the form of a sum of currents flowing through the load resistors $R_{21}$, $R_{22}$ and base currents of the transistors $T_{23}$, $T_{24}$.

Figure 8:
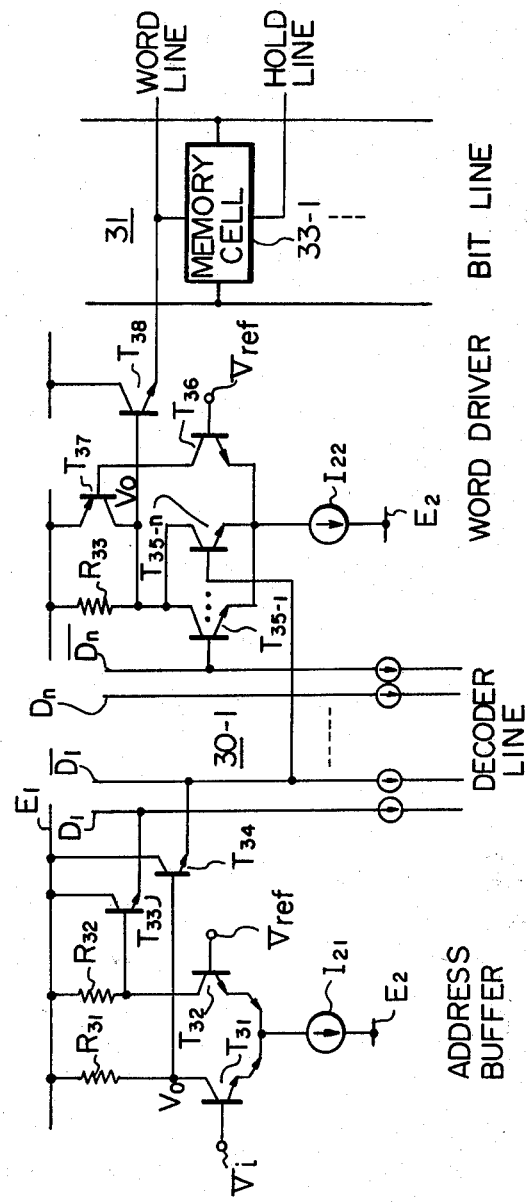
FIG. 8 illustrates an example in which the circuit of the present invention is applied to an address decoder of a memory.

Finally, mentioned below is an example of utilizing the circuit of the present invention. FIG. 8 illustrates an example in which the circuit of the present invention is applied to an address decoder of a memory. Referring to FIG. 8, an address input is fed to an address buffer consisting of transistors $T_{31}$, $T_{32}$, and resistors $R_{31}$, $R_{32}$. The output of the address buffer is fed to decoder lines 30-1 via level-shifting transistors $T_{33}$, $T_{34}$. The output of the decoder 30-1 is fed to a memory cell 31-1 via a word driver which is constructed in the form of a current switch according to the present invention and which is made up of transistors $T_{35-1}$, ... $T_{35-n}$, $T_{36}$, $T_{37}$ and a resistor $R_{33}$, and via a transistor $T_{38}$ for driving the word line. The output is then produced to the word line.

According to the circuit of FIG. 8, the transistors $T_{35-1}$, ... $T_{35-n}$ employed in the circuit of the present invention constitute an output stage for the address decoder. Namely, the output stage of the address decoder constitutes a current switch being made up of the transistor $T_{36}$ to which will be applied a reference voltage and a plurality of transistors which are connected in parallel and which will be served with address signal bits selected from those consisting of $A_1, A_2, \ldots A_n$ and $\overline{A}_1, \overline{A}_2, \ldots \overline{A}_n$ which are of the inverted form. Here, the plurality of the transistors are represented by $T_{35-1} \ldots T_{35-n}$. In the address decoder, when the signals selected from the signals $A_1, A_2, \ldots \overline{A}_n$ are all of the low level, the transistors $T_{35-1} \ldots T_{35-n}$ are all rendered non-conductive, whereby the output voltage $V_O$ acquires the high level so that the word line becomes high level. However, the number of the transistors $T_{35-1} \ldots T_{35-n}$ increases with the increase in the number n of the address signal bits, and the speed at which the output voltage $V_O$ acquires the high level becomes slow, i.e., the speed for selecting the word lines becomes slow. Therefore, a transistor $T_{37}$ is inserted in the circuit of the transistor $T_{36}$ to temporarily feed the collector current to the transistors $T_{35-1} \ldots T_{35-n}$ in order to electrically charge the parasitic collector capacities of the transistors $T_{35-1} \ldots T_{35-n}$. By so doing, the speed for selecting the word lines can be increased.

According to the current switch of the present invention, as illustrated in detail in the foregoing, the collector capacity of a transistor while it is non-conductive is electrically charged by a pnp-type transistor utilizing the operation of another transistor while it is conductive, in order to improve the rising and breaking characteristics of the output voltage. Consequently, the circuit of the present invention can be very effectively employed for logic circuits, memory decoders, and the like.

I claim:

1. In an electronic circuit of a current switch construction in which the emitters of a first transistor and a second transistor are commonly connected to a constant-current supply, and a load resistor is connected to the collector of the first transistor thereby to provide an output from the collector, the improvement being a third transistor in which temporarily flows an electric current to a collector circuit of the first transistor when it is rendered non-conductive, said third inserted transistor being in a collector circuit of the second transistor, a load resistor being connected between the collector of said first transistor and a power supply, the base and emitter of said third transistor being connected between the collector of said second transistor and said power supply, the collector of said third transistor being connected to a connection point between the collector of said first transistor and said load resistor, an input voltage being applied to the base of said first transistor, a reference voltage being applied to the base of said second transistor, and an output being provided from the collector of said first transistor, a Schottky barrier diode being connected across the base and the collector of said third transistor.

2. In an electronic circuit of a current switch construction in which the emitters of a first transistor and a second transistor are commonly connected to a constant-current supply, and a load resistor is connected to the collector of the first transistor thereby to provide an output from the collector, the improvement being a third transistor in which temporarily flows an electric current to a collector circuit of the first transistor when it is rendered non-conductive, said third transistor being inserted in a collector circuit of the second transistor, a load resistor being connected between the collector of said second transistor and the power supply, the base and emitter of said third transistor being connected between the collector of said first transistor and said power supply, the collector of said third transistor being connected to a connection point between the collector of said second transistor and said load resistor, an input voltage being applied to the base of said first transistor, a reference voltage being applied to the base of said second transistor, and an output being provided from the collector of said second transistor, a Schottky barrier diode is connected across the base and the collector of said third transistor.

3. An electronic circuit according to claim 1, wherein a resistor is connected between the collector of said first transistor and a connection point which connects the collector of said third transistor and said Schottky barrier diode.

4. An electronic circuit according to claim 2, wherein a resistor is connected between the collector of said second transistor and a connection point which connects the collector of said third transistor and said Schottky barrier diode.

5. In an electronic circuit of a current switch construction in which the emitters of a first transistor and a second transistor are commonly connected to a constant-current supply, and a load resistor is connected to the collector of the first transistor thereby to take out an output from the collector, the improvement being at least a third transistor in which temporarily flows an electric current to a collector circuit of the first transistor when it is rendered non-conductive, said third transistor being connected in a collector circuit of the second transistor, the collector circuit of said second transistor consists of a load resistor connected between the collector of said second transistor and the power supply, and a fourth transistor of the type of an emitter follower of which the base is connected to a connection point which connects said load resistor and said second transistor, of which the collector is connected to said power supply and of which the emitter serves as an output terminal, and wherein the base and emitter of said third transistor is connected between the collector of said first transistor and said power supply, the collector of said third transistor is connected to the emitter of said fourth transistor, an input voltage is applied to the base of said first transistor, and an output is taken out from the emitter of said fourth transistor.

6. In an electronic circuit of a current switch construction in which the emitters of a first transistor and a second transistor are commonly connected to a constant-current supply, and a load resistor is connected to the collector of the first transistor thereby to take out an output from the collector, the improvement being at least a third transistor in which temporarily flows an electric current to a collector circuit of the first transistor when it is rendered non-conductive, said third transistor being connected in a collector circuit of the second transistor, said first transistor consists of a group of transistors which are connected in parallel with each other, a load resistor is connected between the collectors of said group of transistors and said power supply, the base and emitter of said third transistor is connected between the collector of said second transistor and said power supply, the collector of said third transistor is connected to a connection point which connects the collectors of said group of transistors and said load resistor, an input voltage is applied to the bases of said group of transistors, a reference voltage is applied to the base of said second transistor, and an output is taken out from the connection point which connects the collectors of said group of transistors and said load resistor.

* * * * *

UNITED STATES PATENT AND TRADEMARK OFFICE
CERTIFICATE OF CORRECTION

PATENT NO. : 4,355,245

DATED : October 19, 1982

INVENTOR(S) : Hideaki Isogai

It is certified that error appears in the above-identified patent and that said Letters Patent is hereby corrected as shown below:

Front page, [57] ABSTRACT, line 6, "a pnp-" should be --at least a third--;
        [57] ABSTRACT, line 6, delete "type".

Column 3, line 7, after "level" insert --by--;
        line 7, delete "by";
        line 12, "the" should be --this--;
Column 6, line 18, "the" (second occurrence) should be --this--;
        line 35, "22" should be --21--;
        line 56, "31-1" should be --33-1--.

Signed and Sealed this

Eighth Day of March 1983

[SEAL]

Attest:

GERALD J. MOSSINGHOFF

Attesting Officer     Commissioner of Patents and Trademarks